US012791590B2

(12) United States Patent
Chaves Garcia et al.

(10) Patent No.: US 12,791,590 B2
(45) Date of Patent: Nov. 10, 2026

(54) SMART VOLTAGE DISCRIMINATOR FOR A MULTI-VOLTAGE SOURCE

(71) Applicants: Jordi Chaves Garcia, Barcelona (ES); Juan Miguel Chaves Garcia, Barcelona (ES)

(72) Inventors: Jordi Chaves Garcia, Barcelona (ES); Juan Miguel Chaves Garcia, Barcelona (ES)

( * ) Notice: Subject to any disclaimer, the term of this patent is extended or adjusted under 35 U.S.C. 154(b) by 150 days.

(21) Appl. No.: 18/855,129

(22) PCT Filed: Jun. 15, 2022

(86) PCT No.: PCT/ES2022/070376
§ 371 (c)(1),
(2) Date: Oct. 8, 2024

(87) PCT Pub. No.: WO2023/203261
PCT Pub. Date: Oct. 26, 2023

(65) Prior Publication Data

US 2025/0251428 A1 Aug. 7, 2025

(51) Int. Cl.
*G01R 19/00* (2006.01)

(52) U.S. Cl.
CPC ................................ *G01R 19/0038* (2013.01)

(58) Field of Classification Search
CPC ................ G01R 19/00; G01R 19/0053; G01R 19/0038; G01R 1/203; G01R 17/00; G01R 17/12; G01R 27/08
See application file for complete search history.

(56) References Cited

U.S. PATENT DOCUMENTS

| | | | |
|---|---|---|---|
| 4,728,898 A | 3/1988 | Staley, Jr. | |
| 5,182,511 A * | 1/1993 | Pierret ...................... | H02J 7/16 340/661 |
| 2010/0315102 A1 | 12/2010 | Lionel | |
| 2011/0234203 A1 | 9/2011 | Chang | |
| 2017/0336464 A1 | 11/2017 | Blumschein | |

* cited by examiner

*Primary Examiner* — Son T Le

(74) *Attorney, Agent, or Firm* — Albert Bordas, Esq.

(57) ABSTRACT

A voltage discriminator having three inputs, one of them is for a common signal and the other two are the signals to be discriminated, with each of the three signals being input to a three-phase rectifier bridge. A measurement signal is taken from the signals to be discriminated by means of a high impedance measurement resistor, allowing a very low current to pass, with each high impedance resistor being connected in series with an offset signal generator and the output of which is compared with the other signal without any reduction in value in a comparator. The output of each comparator is a logic value “1” or “0” if the value is greater than a threshold value or not, respectively. The discriminator is suitable for multi-voltage sources. The discriminator itself adapts automatically to the input voltage. The discriminator has a lower energy consumption, is of great simplicity and high functionality.

2 Claims, 1 Drawing Sheet

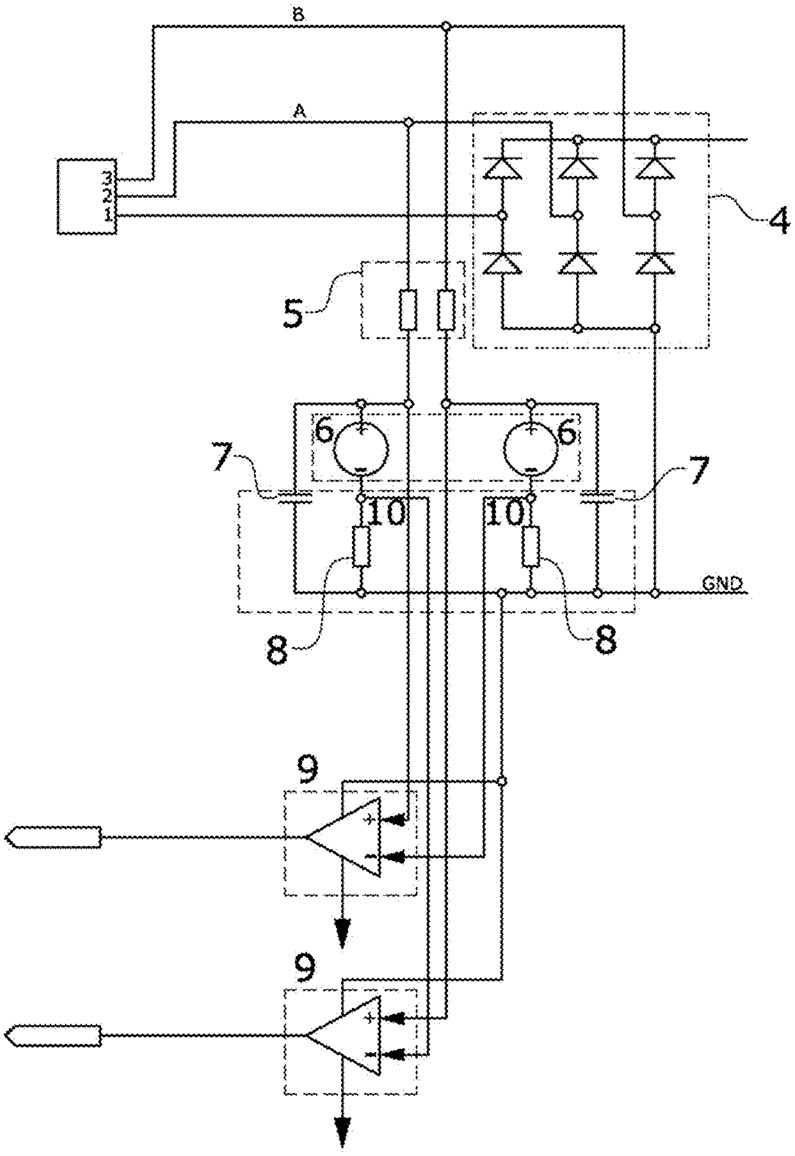
B
A
3
2
1
4
5
6
6
7
7
10
10
8
8
GND
9
9

SMART VOLTAGE DISCRIMINATOR FOR A MULTI-VOLTAGE SOURCE

OBJECT OF THE INVENTION

The object of the present invention relates to a smart voltage discriminator for a multi-voltage source having the particularity that it adapts to the input voltage.

The present invention is characterized by the special design and configuration of each and every one of the elements used in such a way as to achieve a discriminator that is highly functional, simple and energy-saving.

Therefore, the present invention is comprised within the field of devices used in voltage discrimination.

BACKGROUND OF THE INVENTION

In the state of the art, when several cables run in parallel, especially in long distances of several hundred meters, the fact is that in some of the cables, although they do not have any voltage, a voltage is induced by coupling and/or by a lack of quality of the cables, this gives rise to false signals that are a source of erroneous maneuvers, so it is necessary to be able to discriminate which of the voltages that run through the cables is the good signal.

In the state of the art, this signal discrimination is done by means of an optocoupler and a resistor. Although it is a possible way to achieve signal discrimination, this embodiment presents significant energy consumption problems, since energy is continuously being dissipated, and there are even situations wherein it is not possible to discriminate the correct input.

In addition, the discriminator must be suitable for high voltage range multi-voltage sources, which could range from 24 V to 240 Volts. Therefore, the discriminator must be designed in such a way that it adapts to the input voltage.

Discriminators that adapt to the input voltage are unknown in the state of the art.

Therefore, an object of the present invention relates to developing a voltage discriminator suitable for multi-voltage sources, wherein the discriminator itself adapts automatically to the input voltage, wherein the discriminator furthermore has a lower energy consumption, is of great simplicity and high functionality, developing a discriminator like the one described below and the essential nature of which is described in claim 1.

DISCLOSURE OF THE INVENTION

The essential nature of the object of the present invention is described in the independent claim, and the different embodiments are described in the dependent claims.

The object of the present invention relates to a smart voltage discriminator for a multi-voltage source comprising a series of inputs, preferably three, wherein one of them is for a common signal and the other two are the signals to be discriminated, with each of the three signals being input to a three-phase rectifier bridge, wherein a measurement signal is taken from the signals to be discriminated by means of a high impedance measurement resistor, allowing a very low current to pass, with each high impedance resistor being connected in series with an offset signal generator and the output of which is compared with the other signal without any reduction in value in a comparator, wherein the output of each comparator is a logic value “1” or “0” if the value is greater than a threshold value or not, respectively.

Each of the generators of the offset signal of each signal to be discriminated comprises a voltage source generating an offset value of the voltage, with the output thereof being connected with a resistor and the entire voltage source and resistor assembly is connected in parallel with a capacitor, and a reduced signal of the signal to be analyzed is taken from the connection point between the voltage source and the resistor and taken to a comparator.

The capacitor has the function of filtering and getting the comparison to be made with an approximation of the mean size of the input signal, and not of the peak voltage. The mean voltage provided by the capacitor is more reliable than a peak voltage.

The discriminator comprises two comparators, a first comparator and a second comparator, wherein in the first comparator the first signal without any offset is compared with the second signal to which an offset has been applied, whereas in the second comparator the second signal without any offset is compared with the first signal to which an offset has been applied.

The output of each comparator is a logic signal of “1” or “0” according to whether the difference of the comparator is greater than a pre-established threshold value in such a way that the output of the comparator that provides a value of “0” is discarded.

Unless indicated otherwise, all the technical and scientific elements used in the present specification have the meaning that is usually understood by one skilled in the art to which this invention belongs. When putting the present invention into practice, methods and materials similar or equivalent to those described in the specification can be used.

Throughout the description and the claims, the word “comprises”, and variants thereof are not intended to exclude other technical features, additives, components or steps. For those skilled in the art, other objects, advantages and features of the invention will be inferred in part from the description and in part from practice of the invention.

BRIEF DESCRIPTION OF THE FIGURES

To complement the description being made and for the purpose of helping to better understand the features of the invention according to a preferred practical embodiment thereof, a set of drawings is attached as an integral part of the description, in which drawings the following has been depicted in an illustrative and non-limiting manner.

FIG. 1 shows a depiction of the electrical diagram of the discriminator object of the invention.

PREFERRED EMBODIMENT OF THE INVENTION

In FIG. 1, it can be observed that the discriminator object of the invention comprises a series of inputs (1), (2) and (3) which correspond with a signal (COMMON), signal (A) and signal (B) respectively, wherein the intention is to be able to discriminate whether one of the signals is an incorrect signal despite having a certain voltage.

The voltage in one of the cables can be the result of excessive noise, excessive length or a combination of factors, with it being necessary to be able to discriminate whether the voltage shown in one of the cables is a valid voltage or not.

This has an important relevance, especially for valve command signals and the like.

The signals (COMMON), (A) and (B) are taken to a rectifier bridge (4), where a feed signal is obtained.

Signals (A) and (B) are the signals to be discriminated and before the input to the bridge rectifier a connecting cable is derived on which a high impedance measuring resistor (5) is arranged followed by an offset signal generator, the output of which is in connection with a comparator.

Each of the offset signal generators, both for signal (A) and for signal (B), comprises a voltage source (6) generating an offset value of the voltage with the output thereof being connected with a resistor (8), and the entire voltage source (6) and resistor (8) assembly is connected in parallel with a capacitor (7), and a reduced signal (10) of the signal to be analyzed is taken from the connection point between the voltage source (6) and the resistor (8) and taken to a comparator (9), (10).

The discriminator comprises a first comparator (9) and a second comparator (10), wherein signal (A) without any offset and signal (B) to which an offset has been applied reach the first comparator (9) in order to be compared, whereas signal (B) without any offset and signal (A) to which an offset has been applied reach the second comparator in order to be compared.

The discriminator truth table is:

| | A > B + 8 V | B > A + 8 V | Other result |
|---|---|---|---|
| Comparator (9) | 1 | 0 | 1 |
| Comparator (10) | 0 | 1 | 1 |

Therefore, as can be observed, when signal (A) is greater than signal (B) to which an offset of 8 volts has been applied, for example, a "1" is generated in the comparator (9), whereas when signal (B) is greater than a signal (A) offset by the 8 volts, a "0" is generated, or a "1" being generated in other cases, whereas in the comparator (10) when voltage (A) is greater than signal (B) offset by more than 8 volts, for example, a value of "0" is generated, whereas when signal (B) is greater than a signal (A) offset by those 8 volts, a "1" is generated, or a "1" being generated in other cases.

It can also be observed in the table that the discriminator is capable of identifying two signals as valid, when they are separated by less than 8V.

This allows those signals resulting from induction due to noise or excessive length in parallel with other cables to be discriminated, wherein discrimination is carried out in a simple and highly effective manner with energy savings.

Having sufficiently described the nature of the present invention, as well as how to put it into practice, it is hereby stated that, within its essential nature, the invention may be carried out to practice in other embodiments differing in detail from the embodiment indicated by way of example, and such embodiments will also be covered by the protection sought, provided that it does not alter, change or modify its fundamental principle.

The invention claimed is:

1. A smart voltage discriminator for a multi-voltage source, characterized in that it comprises a series of inputs (1), (2) and (3), wherein one of them is for a common signal (COMMON) and the other two are the signals to be discriminated, signal (A) and signal (B), with each of the three signals being input to a three-phase rectifier bridge (4), wherein a measurement signal is taken from the signals to be discriminated by means of a high impedance measurement resistor (5), connected in series with an offset signal generator and the output of which is compared with the other signal without any reduction in value in a comparator, wherein the output of each comparator is a logic value "1" or "0" if the value is greater than a threshold value or not, respectively, the discriminator comprises two comparators, a first comparator (9) and a second comparator (10), wherein in the first comparator (9) the signal (A) without any offset is compared with the signal (B) to which an offset has been applied, whereas in the second comparator (10) the signal (B) without any offset is compared with the signal (A) to which an offset has been applied.

2. The smart voltage discriminator for a multi-voltage source according to claim 1, characterized in that each of the generators of the offset signal of each signal to be discriminated comprises a voltage source (6) generating an offset value of the voltage, with the output thereof being connected with a resistor (8) and the entire voltage source (6) and resistor (8) assembly is connected in parallel with a capacitor (7), and a reduced signal of the signal to be analyzed is taken from the connection point between the voltage source (6) and the resistor (8) and taken to a comparator (9), (10).

* * * * *